US012733240B2

(12) United States Patent
Xie et al.

(10) Patent No.: US 12,733,240 B2
(45) Date of Patent: Sep. 8, 2026

(54) STRUCTURE WITH SELF-ALIGNED OFFSET GATE CONTACT AND DIRECT BACKSIDE CONTACT

(71) Applicant: International Business Machines Corporation, Armonk, NY (US)

(72) Inventors: Ruilong Xie, Niskayuna, NY (US); Brent A. Anderson, Jericho, VT (US); Albert M. Chu, Nashua, NH (US); Ravikumar Ramachandran, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 363 days.

(21) Appl. No.: 18/239,526

(22) Filed: Aug. 29, 2023

(65) Prior Publication Data

US 2025/0081581 A1 Mar. 6, 2025

(51) Int. Cl.

| | |
|---|---|
| ***H10D 64/23*** | (2025.01) |
| ***H10D 30/00*** | (2025.01) |
| ***H10D 30/01*** | (2025.01) |
| ***H10D 30/67*** | (2025.01) |
| ***H10D 62/10*** | (2025.01) |
| ***H10D 64/01*** | (2025.01) |
| ***H10D 84/01*** | (2025.01) |
| ***H10D 84/83*** | (2025.01) |
| ***H10W 20/40*** | (2026.01) |
| *H10D 84/03* | (2025.01) |

(52) U.S. Cl.

CPC ....... *H10D 64/258* (2025.01); *H10D 30/0198* (2025.01); *H10D 30/501* (2025.01); *H10D 30/6735* (2025.01); *H10D 62/121* (2025.01); *H10D 64/017* (2025.01); *H10D 84/0149* (2025.01); *H10W 20/482* (2026.01); *H10D 84/038* (2025.01); *H10D 84/83* (2025.01)

(58) Field of Classification Search

CPC ............. H10D 30/0198; H10D 30/501; H10D 30/6735; H10D 62/121; H10D 64/258; H10D 84/0149; H10W 20/482; H01L 21/76897; H01L 23/481

See application file for complete search history.

(56) References Cited

U.S. PATENT DOCUMENTS

| | | | | |
|---|---|---|---|---|
| 8,274,099 | B2 | 9/2012 | Becker | |
| 8,853,793 | B2 | 10/2014 | Becker et al. | |
| 9,786,647 | B1 | 10/2017 | Huang et al. | |
| 9,953,793 | B2 | 4/2018 | Yoneda | |
| 10,854,604 | B1 | 12/2020 | Kuo et al. | |
| 11,152,347 | B2 * | 10/2021 | Song | H10D 84/0186 |
| 2021/0134721 | A1 | 5/2021 | Chiang et al. | |
| 2021/0384316 | A1 * | 12/2021 | Yu | H01L 21/76895 |

(Continued)

*Primary Examiner* — Yara B Green
*Assistant Examiner* — Christopher M Roland
(74) *Attorney, Agent, or Firm* — Scully, Scott, Murphy & Presser, P.C.; L. Jeffrey Kelly, Esq.

(57) ABSTRACT

A semiconductor structure is provided that includes a self-aligned offset frontside gate contact structure and a direct backside source/drain contact structure. The presence of the off-centered frontside gate contact structure is attractive since it mitigates the risk of gate contact-to-source/drain contact shorts and it also improves the metal line, M1, spacing within the overlying frontside back-end-of-the-line (BEOL) structure.

15 Claims, 8 Drawing Sheets

(56) References Cited

U.S. PATENT DOCUMENTS

| | | | | |
|---|---|---|---|---|
| 2022/0336607 | A1 | 10/2022 | Bao et al. | |
| 2023/0369222 | A1* | 11/2023 | Engel | H10D 30/014 |
| 2024/0063122 | A1* | 2/2024 | Yun | H10D 84/0149 |
| 2024/0332182 | A1* | 10/2024 | Mignot | H01L 21/76831 |

* cited by examiner 26
20
28
20
28
20
28
16
18
12
24
22
40
38
32
30
14
10
34
36

STRUCTURE WITH SELF-ALIGNED OFFSET GATE CONTACT AND DIRECT BACKSIDE CONTACT

BACKGROUND

The present application relates to semiconductor technology, and more particularly to a semiconductor structure including a self-aligned offset frontside gate contact structure and a direct backside source/drain contact structure.

In semiconductor manufacturing, contact structures such as, for example, a frontside source/drain contact structure, a frontside gate contact structure, and a backside source/drain contact structure are generally formed. Typically, one of the source/drain regions of a transistor is in electrical contact with the frontside source/drain contact structure and the other source/drain region of the transistor is in electrical contact with a backside source/drain contact structure. The frontside source/drain contact structure and the frontside gate contact structure are generally connected to a frontside back-end-of-the-line (BEOL) structure, and the backside source/drain contact structure is generally connected to a backside interconnect structure. As devices scale, shorting between the frontside source/drain contact structure and the frontside gate contact structure is a risk due to the proximity of these two frontside contact structures.

SUMMARY

A semiconductor structure is provided that includes a self-aligned offset frontside gate contact structure and a direct backside source/drain contact structure. The presence of the off-centered frontside gate contact structure is attractive since it mitigates the risk of gate contact-to-source/drain contact shorts and it also improves the metal line, M1, spacing within the overlying frontside BEOL structure.

In one aspect of the present application, a semiconductor structure is provided. In one embodiment, the semiconductor structure includes a transistor including a gate structure, a first source/drain region present on a first side of the gate structure and a second source/drain region present on a second side of the gate structure, wherein the second side of the gate structure is opposite the first side of the gate structure. A dielectric cap is located on a first surface of the second source/drain region. An off-centered frontside gate contact structure is also present. The off-centered frontside gate contact structure has a first portion located directly above, and in direct physical contact with, the gate structure of the transistor, and a second portion off-set relative to the gate structure and located directly on the dielectric cap. The semiconductor structure further includes a backside source/drain contact structure located on a second surface of the second source/drain region, wherein the second surface of the second source/drain region is opposite the first surface of the second source/drain region. In embodiments, the second source/drain region is a replacement source/drain region.

In another aspect of the present application, a method of forming a semiconductor structure is provided. In one embodiment, the method includes forming a sacrificial gate structure on a surface of a substrate, wherein a first source/drain region and a first gate spacer are located on a first side of the sacrificial gate structure, and a second source/drain region and a second gate spacer are located on a second side of the sacrificial gate structure; removing the second source/drain region and a portion of the substrate to provide a backside source/drain contact placeholder structure trench in the substrate; forming a backside source/drain contact placeholder structure in the backside source/drain contact placeholder structure trench and a replacement source/drain structure on the backside source/drain contact placeholder structure; recessing an upper portion of the second gate spacer to provide a recessed gate spacer; forming a dielectric cap on a surface of the recessed gate spacer and the replacement source/drain region; replacing the sacrificial gate structure with a gate structure; forming a gate cap on the gate structure, wherein the gate cap is composed of a dielectric material that is compositionally different from a dielectric material that provides the dielectric cap; forming a middle-of-the-line (MOL) dielectric layer having a frontside source/drain contact opening that physically exposes the first source/drain region; forming a frontside gate contact opening in the MOL dielectric layer that partially exposes the gate structure, wherein the forming the frontside gate contact opening includes selectively removing a portion of the gate cap; forming a frontside source/drain contact structure in the frontside source/drain contact opening and a frontside gate contact structure in the frontside gate contact opening, wherein the frontside gate contact structure has a first portion located directly above, and in direct physical contact with the gate structure, and a second portion off-set relative to the gate structure and located directly on the dielectric cap; removing the substrate to expose the backside source/drain contact placeholder structure; forming a backside interlayer dielectric layer adjacent to the backside source/drain contact placeholder structure; and replacing the backside source/drain contact placeholder structure with a backside source/drain contact structure.

DETAILED DESCRIPTION

Figures 1, 2:
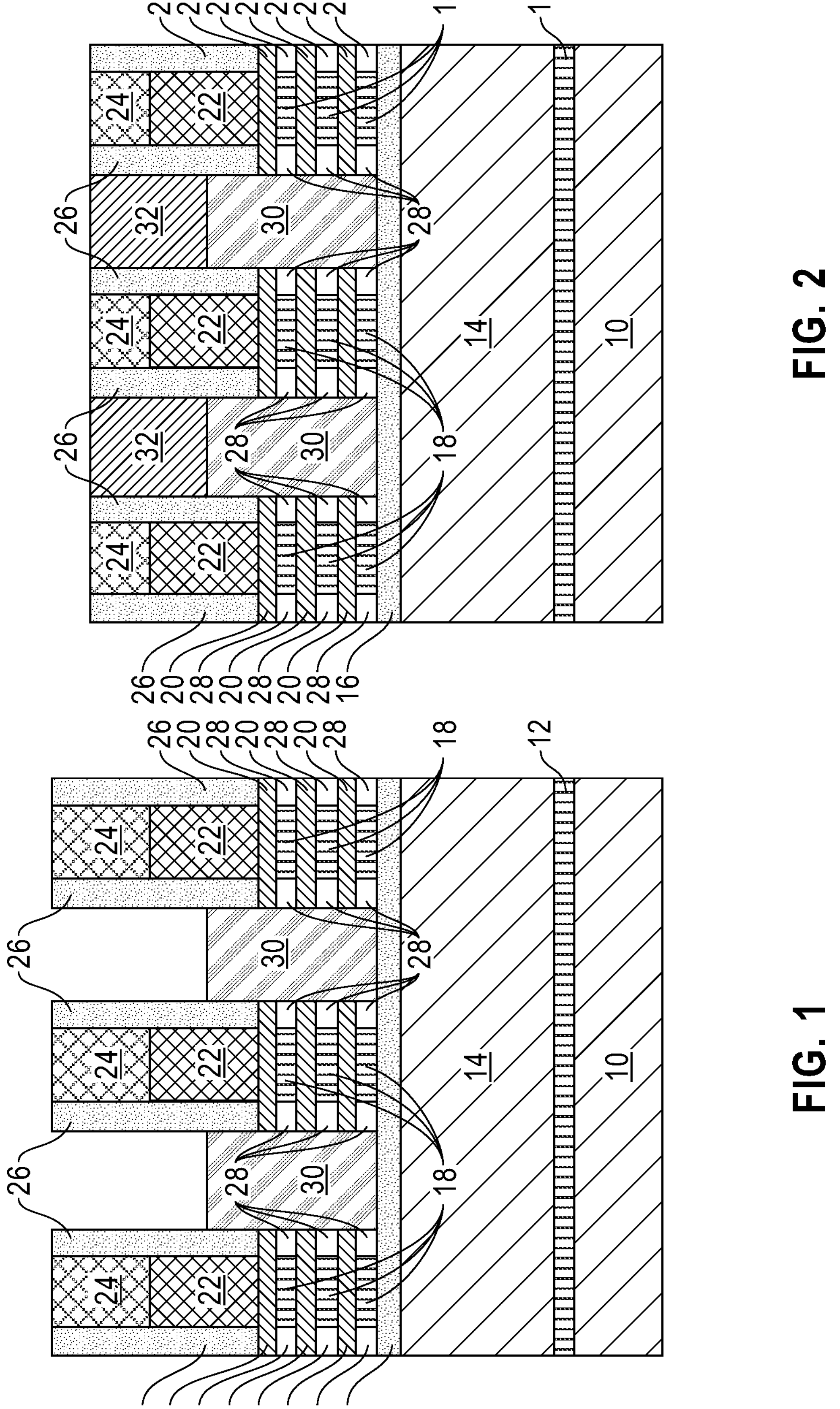
FIG. 1 is a cross sectional view of an exemplary semiconductor structure that can be employed in the present application, the exemplary structure includes a sacrificial gate structure located on a nanosheet stack of alternating sacrificial semiconductor material nanosheets and semiconductor channel material nanosheets, and a source/drain region located on each side of the nanosheet stack, wherein the nanosheet stack and each source/drain region is located on a bottom dielectric isolation layer, the bottom dielectric isolation layer is located on a substrate including, from bottom to top, a first semiconductor layer, an etch stop layer and a second semiconductor layer.
FIG. 2 is a cross sectional view of the exemplary semiconductor structure shown in FIG. 1 after forming a first frontside interlayer dielectric (ILD) layer on each source/drain region.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

In the present application, a semiconductor structure is described and illustrated as containing nanosheet transistors. A transistor (or field effect transistor (FET)) includes a source region, a drain region, a semiconductor channel region located between the source region and the drain region, and a gate structure located above the semiconductor channel region. Collectively, the source region and the drain region can be referred to as a source/drain region. A nanosheet transistor is a non-planar transistor that includes a vertical stack of spaced apart semiconductor channel material nanosheets as the semiconductor channel region with a pair of source/drain regions located at each of the ends of the vertical stack of spaced apart semiconductor channel material nanosheets. The gate structure includes a gate dielectric and a gate electrode. The gate structure wraps around a portion of each of the spaced apart semiconductor channel material nanosheets. In some cases, nanosheets transistors are thus referred to as gate-all-around (GAA) transistors.

Although the present application describes and illustrates nanosheet transistors, other types of transistors can be used instead of nanosheet transistors. The other types of transistors that can be used include, but are not limited to, planar transistors, finFETs, semiconductor nanowire FETs, and stacked FETs.

In the present application, the semiconductor structure includes a frontside and a backside. The frontside of the semiconductor structure of the present application includes a side of the structure that includes the nanosheet transistors, frontside contact structures, and the frontside BEOL structure. The backside of the semiconductor structure of the present application is the side of the structure that is opposite the frontside. The backside includes a backside contact structure, and a backside interconnect structure.

Figure 15:
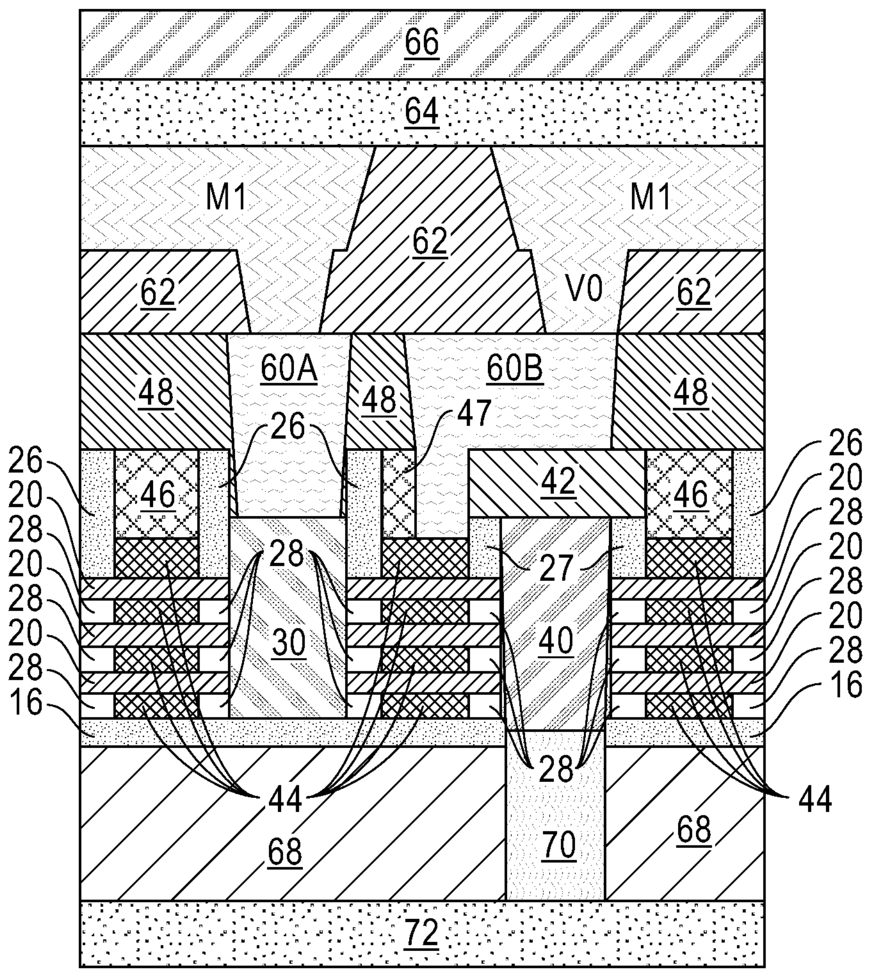
FIG. 15 is a cross sectional view of the exemplary semiconductor structure shown in FIG. 14 after forming a backside interconnect structure.

As stated above, a semiconductor structure is provided. In one embodiment and is illustrated in FIG. 15, the semiconductor structure includes a transistor including a gate structure (i.e., middle gate structure 44 shown in FIG. 15), a first source/drain region (e.g., source/drain region 30) present on a first side of the gate structure (i.e., middle gate structure 44 shown in FIG. 15), and a second source/drain region (e.g., replacement source/drain region 40) present on a second side of the gate structure (i.e., middle gate structure 44 shown in FIG. 15), wherein the second side of the gate structure is opposite the first side of the gate structure. Dielectric cap 42 is located on a first surface of the second source/drain region (e.g., the replacement source/drain region 40). Off-centered frontside gate contact structure (i.e., frontside gate contact structure 60B) is also present in which the off-centered frontside gate contact structure (i.e., frontside gate contact structure 60B) has a first portion located directly above, and in direct physical contact with the gate structure of the transistor, and a second portion off-set relative to the gate structure and located directly on the dielectric cap 42. The semiconductor structure further includes backside source/drain contact structure 70 located on a second surface of the second source/drain region (e.g., the replacement source/drain region 40), wherein the second surface of the second source/drain region (e.g., the replacement source/drain region 40) is opposite the first surface of the second source/drain region (e.g., the replacement source/drain region 40). The presence of the off-centered frontside gate contact structure is attractive since it mitigates the risk of gate contact-to-source/drain contact shorts and it also improves the metal line, M1, tip-to-tip spacing within the overlying frontside back-end-of-the-line (BEOL) structure.

Referring first to FIG. 1, there is illustrated an exemplary semiconductor structure that can be employed in the present application. The illustrated exemplary structure of FIG. 1 includes a sacrificial gate structure 22 located on a nanosheet stack of alternating sacrificial semiconductor material nanosheets 18 and semiconductor channel material nanosheets 20, and a source/drain region 30 located on each side (i.e., a first side and a second side) of the nanosheet stack. In the present application, three sacrificial gate structure 22 and three nanosheet stacks are shown in FIG. 1 by way of one example. The present application is not limited to that number of sacrificial gate structures 22 and that number of nanosheet stacks. Instead, the present application works with any number of sacrificial gate structures 22 and any number of nanosheet stacks so long as each nanosheet has a least one sacrificial gate structure 22 present thereon. In the present application, the sacrificial gate structure 22 straddles over the nanosheet stack. The terms "straddles" or 'straddling" denotes that one material layer/structure is located along sidewalls and atop, at least one other layer/structure.

In the present, the nanosheet stack and each source/drain region 30 is located on a bottom dielectric isolation layer 16. In the present application, the bottom dielectric isolation layer 16 is located on a substrate including, from bottom to top, a first semiconductor layer 10, an etch stop layer 12 and a second semiconductor layer 14. In some embodiments, the bottom dielectric isolation layer 16 can be omitted from the exemplary structure.

Also shown in FIG. 1 are sacrificial hard mask caps 24, gate spacers 26 and inner spacers 28. In the present application, the sacrificial hard mask cap 24 is typically, but not necessarily always, present on top of the sacrificial gate structure 22; embodiments can include omission of the sacrificial hard mask cap 24. The gate spacer 26 is present along sidewalls of the sacrificial gate structure 22 and, if present, sidewalls of the sacrificial hard mask cap 24. Inner spacers 28 are located at the ends of each sacrificial semiconductor material nanosheets 18, and the inner spacers 28 will subsequently serves as pillars to support each of the semiconductor channel material nanosheets 20 during removal of the sacrificial semiconductor material nanosheets 18.

Each of the above-described elements/components that are illustrated in FIG. 1 is now described in greater detail. The first semiconductor layer 10 is composed of a first semiconductor material, and the second semiconductor layer 14 is composed of a second semiconductor material. The term "semiconductor material" is used throughout the present application to denote a material having semiconducting properties. Examples of semiconductor materials that can be used in the present application in providing the first semiconductor material and the second semiconductor material include, but are not limited to, silicon (Si), a silicon germanium (SiGe) alloy, a silicon germanium carbide (SiGeC) alloy, germanium (Ge), III/V compound semiconductors or II/VI compound semiconductors. The second semiconductor material that provides the second semiconductor layer 14 can be compositionally the same as, or compositionally different from, the first semiconductor material that provides the first semiconductor layer 10.

In some embodiments of the present application, the etch stop layer 12 can be composed of a dielectric material such as, for example, silicon dioxide and/or boron nitride. In other embodiments of the present application, the etch stop layer 12 is composed of a semiconductor material that is compositionally different from the first semiconductor material that provides the first semiconductor layer 10 and the second semiconductor material that provides the second semiconductor layer 14. In one example, the first semiconductor layer 10 is composed of silicon, the etch stop layer 12 is composed of silicon dioxide, and the second semiconductor layer 14 is composed of silicon. In another example, the first semiconductor layer 10 is composed of silicon, the etch stop layer 12 is composed of silicon germanium, and the second semiconductor layer 14 is composed of silicon.

The substrate including the first semiconductor layer 10, the etch stop layer 12 and the second semiconductor layer 14 can be formed utilizing techniques well known to those skilled in the art. For example, the substrate including the first semiconductor layer 10, the etch stop layer 12 and the second semiconductor layer 14 can be formed by a separation by ion implantation of oxygen process, or wafer bonding. Alternatively, the substrate including the first semiconductor layer 10, the etch stop layer 12 and the second semiconductor layer 14 can be formed by deposition of the various substrate layers one on top the other. The deposition used in forming the various substrate layers can include, but is not limited to, chemical vapor deposition (CVD), plasma enhanced chemical vapor deposition (PECVD), or epitaxial growth. The terms "epitaxial growth" or "epitaxially growing" means the growth of a semiconductor material on a growth surface of another semiconductor material, in which the semiconductor material being grown has the same crystalline characteristics as the growth surface of the another semiconductor material. In an epitaxial deposition process, the chemical reactants provided by the source gases are controlled and the system parameters are set so that the depositing atoms arrive at the growth surface of the another semiconductor material with sufficient energy to move around on the growth surface and orient themselves to the crystal arrangement of the atoms of the growth surface. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking.

As mentioned above, the nanosheet stack includes alternating sacrificial semiconductor material nanosheets 18 and semiconductor channel material nanosheets 20. In some embodiments and as is illustrated in FIG. 1, there is an equal number of sacrificial semiconductor material nanosheets 18 and semiconductor channel material nanosheets 20. That is, the nanosheet stack can include 'n' number of semiconductor channel material nanosheets 20 and 'n' number of sacrificial semiconductor material nanosheets 18, wherein n is an integer starting from one; typically n is greater than one. By way of one example, the nanosheet stack includes three sacrificial semiconductor material nanosheets 18 and three semiconductor channel material nanosheets 20. Each sacrificial semiconductor material nanosheet 18 is composed of a third semiconductor material, while each semiconductor channel material nanosheet 20 is composed of a fourth semiconductor material that is compositionally different from the third semiconductor material. In some embodiments, the fourth semiconductor material that provides each semiconductor channel material nanosheet 20 can provide high channel mobility for n-type field effect transistor (FET) devices. In other embodiments, the fourth semiconductor material that provides each semiconductor channel material nanosheet 20 can provide high channel mobility for p-type FET devices. The third semiconductor material that provides each sacrificial semiconductor material nanosheet 18, and the fourth semiconductor material that provides each semiconductor channel material nanosheet 20 can include one of the semiconductor materials mentioned above. In one example, each sacrificial semiconductor material nanosheet 18 is composed of a silicon germanium alloy having a germanium content from 20 atomic percent to 40 atomic percent, and the fourth semiconductor material that provides each semiconductor channel material nanosheet 20 is composed of silicon. Other combinations of semiconductor materials are possible as long as the third semiconductor material that provides each sacrificial semiconductor material nanosheet 18 is compositionally different from the fourth semiconductor material that provides each semiconductor channel material nanosheet 20.

Each sacrificial semiconductor material nanosheet 18 can have a first thickness, and each semiconductor channel material nanosheet 20 can have a second thickness. In the present application, the first thickness can be equal to, greater than, or less than, the second thickness. As is illustrated in FIG. 1, each sacrificial semiconductor material nanosheet 18 has a recessed width as compared to each semiconductor channel material nanosheet 20.

The sacrificial gate structure 22 includes at least a sacrificial gate material. In some embodiments, the sacrificial gate structure 22 can also include a sacrificial gate dielectric material. In such embodiments, the sacrificial gate dielectric material would be located beneath the sacrificial gate material. The optional sacrificial gate dielectric material can be composed of a dielectric material such as, for example, silicon dioxide. The sacrificial gate material can be composed of, for example, polysilicon, amorphous silicon, amorphous silicon germanium or amorphous germanium. The sacrificial hard mask cap 24 is composed of a hard mask material such as, for example, silicon nitride or silicon oxynitride.

The bottom dielectric isolation layer 16, and the gate spacer 26 are formed of a same dielectric spacer material since the bottom dielectric isolation layer 16, and the gate spacer 26 are formed at the same time. The inner spacers 28 are composed of a dielectric spacer material that can be compositionally the same as, or compositionally different from, the dielectric spacer material that provides both the bottom dielectric isolation layer 16, and the gate spacer 26. The dielectric spacer material used in providing the bottom dielectric isolation layer 16, the gate spacer 26 and the inner spacers 28 includes, but is not limited to, silicon dioxide, SiN, SiBCN, SiOCN or SiOC.

The source/drain regions 30 extend outward from a sidewall of each semiconductor channel material nanosheet 20 and can be present on a surface of the bottom dielectric isolation layer 16. Each of the source/drain regions 30 is composed of a fifth semiconductor material and a dopant. As used herein, a "source/drain" region can be a source region or a drain region depending on subsequent wiring and application of voltages during operation of the transistor. The fifth semiconductor material that provides the source/drain regions 30 can be compositionally the same, or compositionally different from, the fourth semiconductor material that provides each semiconductor channel material nanosheet 20. The dopant that is present in the source/drain regions 30 can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, phosphorus and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, each source/drain region 30 can have a dopant concentration of from $4 \times 10^{20}$ atoms/cm$^3$ to $3 \times 10^{21}$ atoms/cm$^3$. The source/drain regions 30 are typically formed by an epitaxial growth process, as defined above. A recess etch can follow the epitaxial growth process.

The exemplary semiconductor structure including the nanosheet stack, the sacrificial gate structure 22, optional sacrificial hard mask cap 24, gate spacer 26, inner spacer 28 and bottom dielectric isolation layer 16 can be formed on the substrate utilizing nanosheet processing techniques that are well known to those skilled in the art. So not to obscure any of the processing steps of the present application, details concerning the nanosheet processing are not provided herein.

Referring now to FIG. 2, there is illustrated the exemplary semiconductor structure shown in FIG. 1 after forming a first frontside ILD layer 32 on each source/drain region 30. The first frontside ILD layer 32 is composed of a dielectric material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer, or any combination thereof. The term "low-k" as used throughout the present application denotes a dielectric material that has a dielectric constant of less than 4.0 (all dielectric constants mentioned herein are relative to a vacuum unless otherwise noted). The first frontside ILD layer 32 can be formed by a deposition process including, but not limited to, CVD, PECVD or spin-on coating. A planarization process such as, for example, chemical mechanical polishing (CMP) follows the deposition process. The planarization process can remove an upper portion of the gate spacer 26, and if present, an upper portion of the sacrificial hard mask cap 24.

Figures 3, 4:
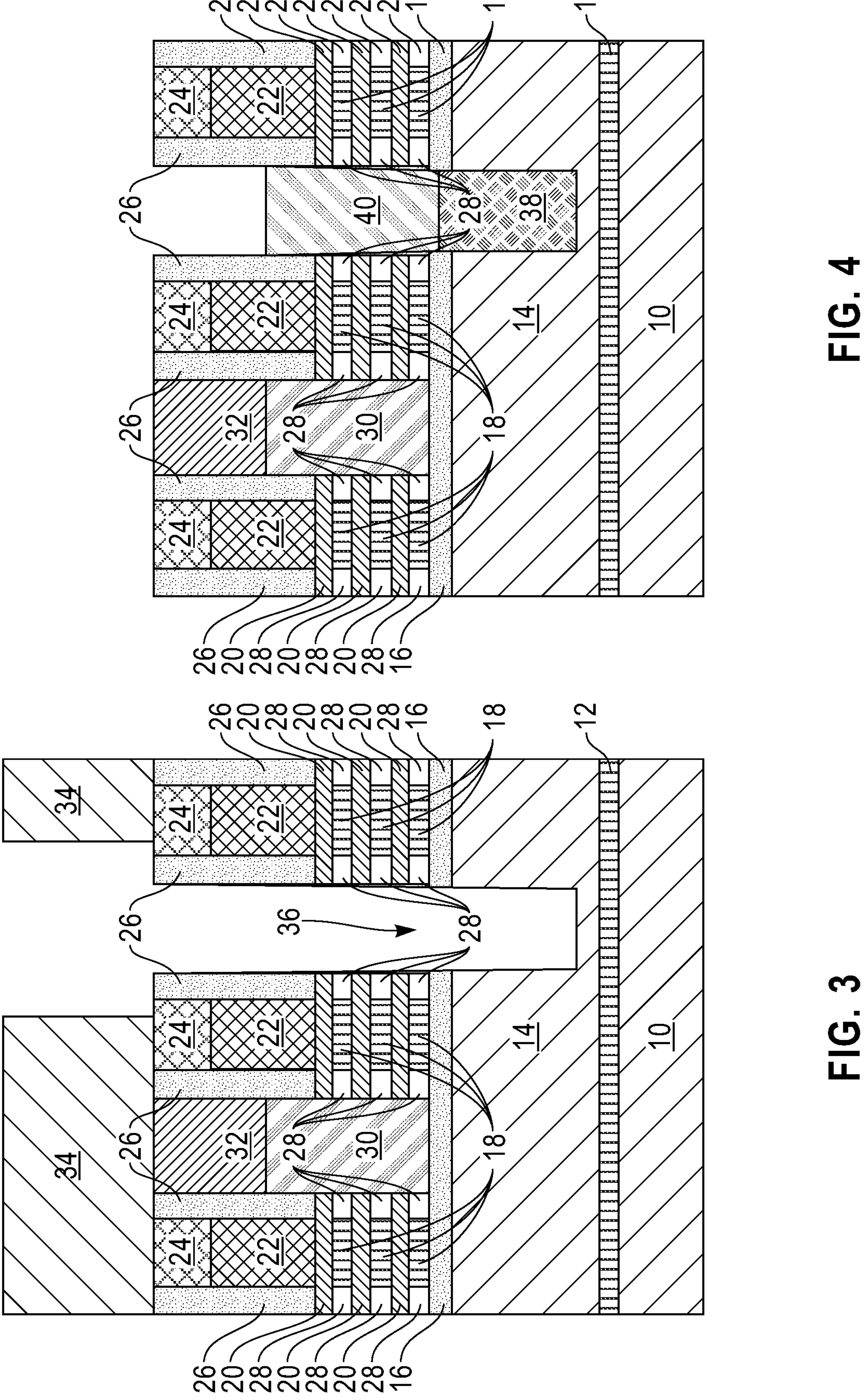
FIG. 3 is a cross sectional view of the exemplary semiconductor structure of FIG. 2 after backside contact patterning, wherein the backside contact patterning forms a backside source/drain contact placeholder structure trench in the substrate.
FIG. 4 is a cross sectional view of the exemplary semiconductor structure shown in FIG. 3 after forming a backside source/drain contact placeholder structure in the backside source/drain contact placeholder structure trench and forming a replacement source/drain region on the backside source/drain contact placeholder structure.

Referring now to FIG. 3, there is illustrated the exemplary semiconductor structure of FIG. 2 after backside contact patterning, wherein the backside contact patterning forms a backside sacrificial placeholder structure trench 36 in the substrate. In the illustrated embodiment, the backside sacrificial placeholder structure trench 36 is formed partially into the second semiconductor layer 14 such that a sub-surface of the second semiconductor layer 14 is physically exposed. The term "sub-surface" denotes a surface of a layer/structure that is located between a bottommost layer and a topmost layer of that layer/structure. Backside contact patterning includes forming a patterned organic planarization layer (OPL) 34 on the surface of the structure shown in FIG. 2. The patterned OPL 34 has an opening that is used in defining the backside sacrificial placeholder structure trench 36. The patterned OPL 34 can be formed by deposition (e.g., CVD, PECVD or spin-coating) of a layer of OPL material, followed by lithographic patterning. Lithographic patterning includes forming a photoresist material on a layer or a stack of layers that need(s) to be patterned, exposing the photoresist material to a pattern of irradiation, developing the exposed photoresist material and then etching the layer or stack of layers that need(s) to be patterned. The etch can include reactive ion etching (RIE), ion beam etching (IBE), plasma etching or any combination thereof.

In the present application, this etch, which is performed on one side of the sacrificial gate structure 22, removes an entirety of the physically exposed first frontside ILD layer 32 that is not protected by the patterned OPL 34, an entirety of the underlying source/drain region 30 that is located directly beneath the physically exposed first frontside ILD layer 32, the entirety of the bottom dielectric isolation layer 16 that is located directly beneath both the physically exposed first frontside ILD layer 32 and the source/drain region 30 and a portion of the second semiconductor layer 14; this etch stops on a sub-surface of the second semiconductor layer 14.

After forming the backside sacrificial placeholder structure trench 36 in the substrate, the patterned OPL 34 can be removed utilizing a conventional material removal process that is selective in removing the patterned OPL 34 from the structure. This removal typically occurs prior to proceeding to the processing steps illustrated in FIG. 4.

Referring now FIG. 4, there is illustrated the exemplary semiconductor structure shown in FIG. 3 after forming a backside source/drain contact placeholder structure 38 in the backside source/drain contact placeholder structure trench 36 and forming a replacement source/drain region 40 on the backside source/drain contact placeholder structure 36. In the present application, the original source/drain region 30 that remains can be referred to a first source/drain region and the replacement source/drain region 40 can be referred to a second source/drain region. The backside source/drain contact placeholder structure 38 will be subsequently replaced with a backside source/drain contact structure. The backside source/drain contact placeholder structure 38 is composed of a sixth semiconductor material which is compositionally different from the second semiconductor material that provides the second semiconductor layer 14 and a seventh semiconductor material that provides the replacement source/drain region 40. In one example, the backside source/drain contact placeholder structure 38 is composed of a silicon germanium alloy. The backside source/drain contact placeholder structure 38 can be formed by deposition (e.g., CVD, PECVD or epitaxial growth) of the sixth semiconductor material, followed by a recess etch.

In addition to including the seventh semiconductor material, the replacement source/drain region 40 also includes a same conductivity type dopant as the remaining original source/drain region 30. The replacement source/drain region 40 can be formed by deposition (e.g., CVD, PECVD or epitaxial growth) of the seventh semiconductor material, followed by a recess etch. The replacement source/drain region 40 extends outward from physically exposed sidewalls of each semiconductor channel material nanosheet and is present on top of the underlying backside source/drain contact placeholder structure 38. The replacement source/drain region 40 is also present on physically exposed sidewalls of the inner spacer 28 and the replacement source/drain region 40 is also partially present along a lower portion of the physically exposed gate spacer 26. The replacement source/drain region 40 does not extend the full height of the gate spacer 26.

Figures 5, 6:
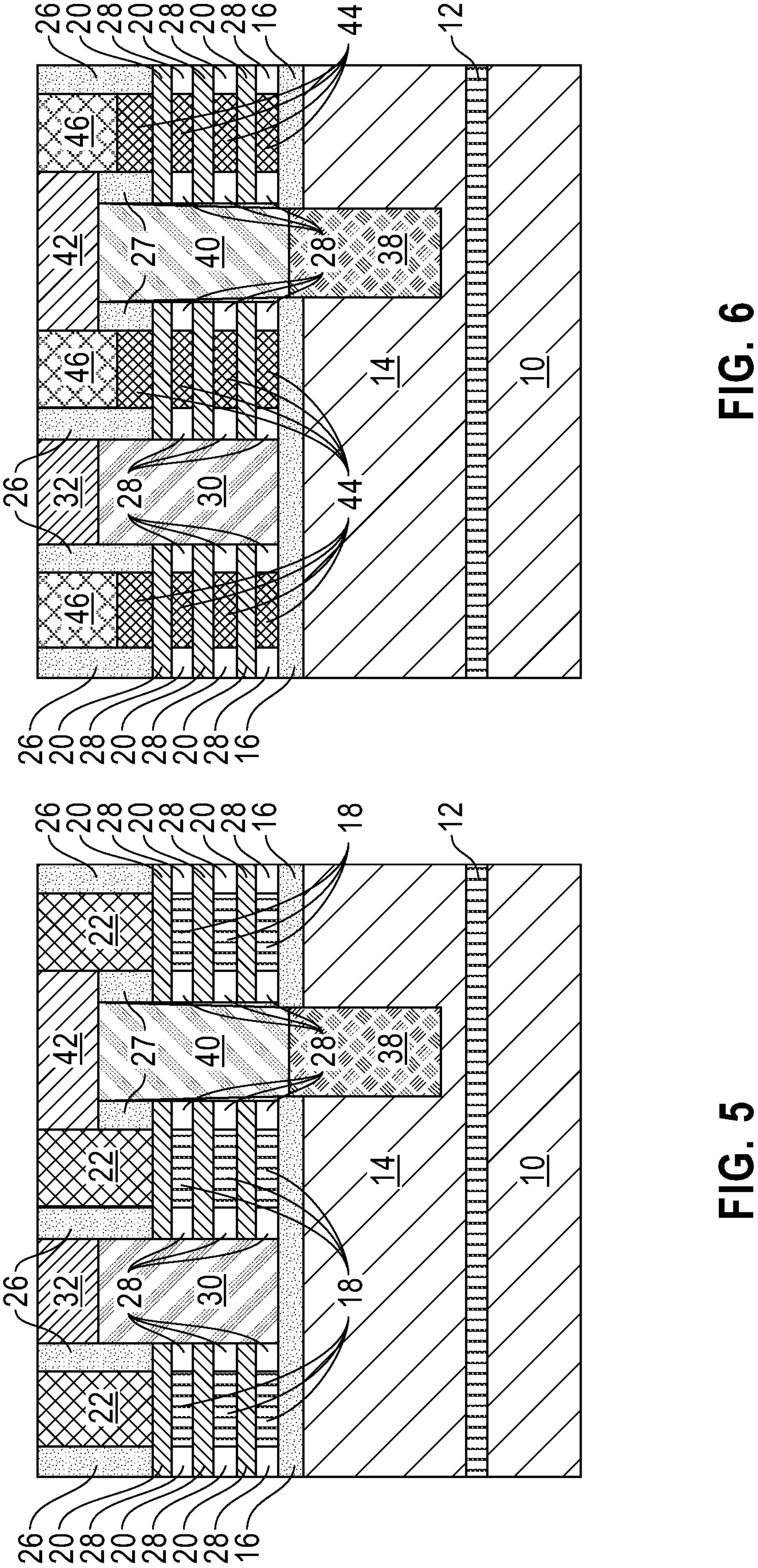
FIG. 5 is a cross sectional view of the exemplary semiconductor structure shown in FIG. 4 after removing an upper portion of a gate spacer located adjacent to the sacrificial gate structure in the area including the replacement source/drain region and forming a dielectric cap on the replacement source/drain region.
FIG. 6 is a cross sectional view of the exemplary semiconductor structure shown in FIG. 5 after removing the sacrificial gate structure to reveal the nanosheet stack, removing each sacrificial semiconductor material nanosheet of the nanosheet stack to suspend a portion of each semiconductor channel material nanosheet, forming a gate structure wrapping around the suspended portion of each semiconductor channel material nanosheet, and forming a gate cap on the gate structure.

Referring now to FIG. 5, there is illustrated the exemplary semiconductor structure shown in FIG. 4 after removing an upper portion of the gate spacer 26 that is located adjacent to the sacrificial gate structure 22 in the area including the replacement source/drain region 40 and forming a dielectric cap 42 on the replacement source/drain region 40. The upper portion of the gate spacer 26 is removed utilizing an isotropic etching process that is selective in removing the dielectric spacer material that provides the gate spacer 26. Isotropic etching is a non-directional etching process in which material removal takes place in all directions. In such an etch, the removal of the gate spacer 26 having a physically exposed sidewall such as in the region including the replacement source/drain region 40 occurs faster than the removal of the gate spacer 26 whose sidewalls are not physically exposed. The isotropic etch forms recessed gate spacer 27 laterally adjacent to the replacement source/drain region 40. The recessed gate spacer 27 has a topmost surface that is typically coplanar with a topmost surface of the replacement source/drain region 40. In some embodiments, the recessed gate spacer 27 can have a topmost surface that is slightly offset (above or below) the topmost surface of the replacement source/drain region 40. The recessed gate spacer 27 has a height that is less than a height of the remaining gate spacers 26.

Dielectric cap 42 is then formed. Dielectric cap 42 is composed of a dielectric material that is compositionally different from the hard mask material that provides the optional hard mask cap 24, and the dielectric material that provides the first frontside ILD layer 32. Illustrative dielectric materials that can be used in providing the dielectric cap 42 include SiC or SiOC. The dielectric cap 24 can be formed by a deposition process such as, for example, CVD, PECVD or ALD. A planarization process can follow the deposition of the dielectric material that provides the dielectric cap 24. This planarization process can be used to remove the hard mask cap 24 and to reveal the sacrificial gate structure 22. An upper portion of the gate spacers 26 and the first frontside ILD layer 42 can be removed during the planarization process. Note that the gate spacer 26 on the side of the nanosheet stack including the original source/drain region 30 has a height that is greater than the recessed gate spacer 27 that is present on the side of the nanosheet stack including the replacement source/drain region 40. As is shown, the dielectric cap 42 has a width that is greater than a width of the underlying replacement source/drain region 40. As is further shown, the dielectric cap 42 covers an entirety of the topmost surface of the both the replacement source/drain region 40 and the recessed gate spacer 27.

Referring now to FIG. 6, there is illustrated the exemplary semiconductor structure shown in FIG. 5 after removing the sacrificial gate structure 22 to reveal the nanosheet stack, removing each sacrificial semiconductor material nanosheet 18 of the nanosheet stack to suspend a portion of each semiconductor channel material nanosheet 20, forming a gate structure 44 wrapping around the suspended portion of each semiconductor channel material nanosheet 20, and forming a gate cap 46 on the gate structure 44.

The sacrificial gate structure 22 can be removed from the structure utilizing a material removal process such as, for example, etching, that is selective in removing the sacrificial gate structure 22. This material removal steps revels the underlying nanosheet stack. After revealing the nanosheet stack, each sacrificial semiconductor material nanosheet 18 is removed to suspend a portion of each semiconductor channel material nanosheet 20. Each sacrificial semiconductor material nanosheet 18 is removed utilizing any material removal process such as, for example, etching, which is selective in removing the sacrificial semiconductor material nanosheets 18.

The gate structure 44 is formed in the area previously accompanied by the sacrificial semiconductor material nanosheets 18 and atop the topmost semiconductor channel material nanosheet 20. The gate structure 44 wraps around each of the semiconductor material nanosheets 20 within the nanosheet stack. The gate structure 44 includes a gate dielectric layer and a gate electrode; both the gate dielectric layer and the gate electrode are not separately shown in the drawing, but both are included in the area shown as the gate structure 44. As is known, the gate dielectric layer is formed directly around the suspended portion of each semiconductor channel material nanosheet 20 and the gate electrode is formed on the gate dielectric layer. The gate dielectric layer of the gate structure 44 is composed of a gate dielectric material that has a dielectric constant of greater than 4.0. Illustrative examples of gate dielectric materials that can be used in providing the gate dielectric layer include, but are not limited to, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide (Pb $(Sc,Ta)O_3$), and/or lead zinc niobite (Pb(Zn,Nb)O). The gate dielectric material can further include dopants such as lanthanum (La), aluminum (Al) and/or magnesium (Mg).

The gate electrode of the gate structure 44 is composed of a gate electrode material. The gate electrode material can include a work function metal (WFM) and optionally a conductive metal. The WFM can be used to set a threshold voltage of the transistor to a desired value. In some embodiments, the WFM can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the WFM can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof. The optional conductive metal can include, but is not limited to aluminum (Al), tungsten (W), or cobalt (Co). The gate structure 44 can be formed by deposition of the gate dielectric material and the gate electrode material, followed by a planarization process which removes any gate dielectric material and gate electrode material that is formed atop the gate spacers 26, first frontside ILD layer 32 and dielectric cap 42.

Following the planarization process, a recess etch can be used to reduce the height of the gate structure 44 and to form a cavity above the gate structure 44 in which gate cap 46 is formed. Gate cap 46 is composed of a dielectric material that is compositionally different from the dielectric material of dielectric cap 42, and the first frontside ILD layer 32 as well as the dielectric spacer material that provides the gate spacer 26. In one example, the gate cap 46 is composed of silicon nitride or silicon oxynitride. The gate cap 46 can be formed by deposition, followed by a planarization process.

Figures 7, 8:
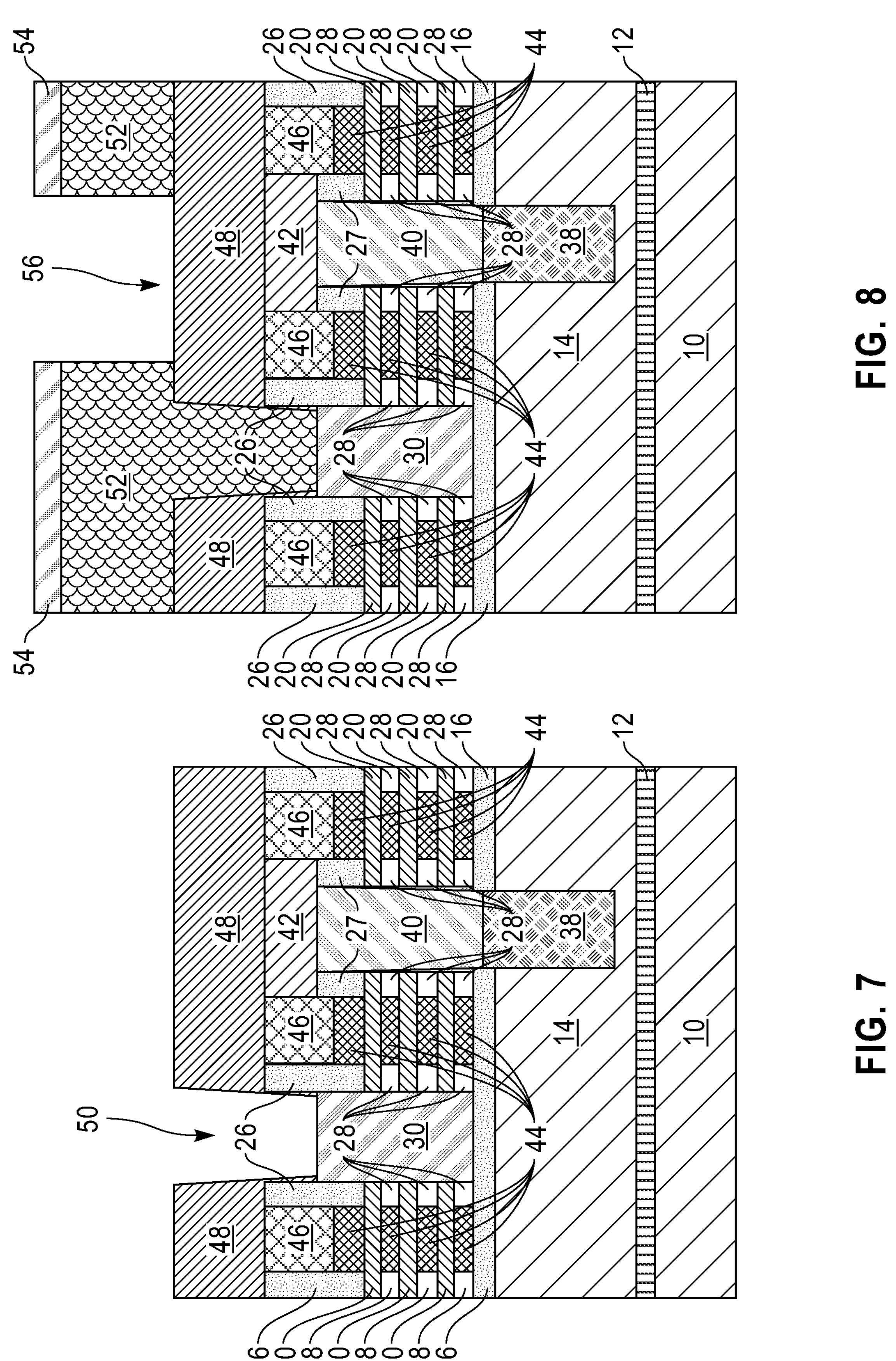
FIG. 7 is a cross sectional view of the exemplary semiconductor structure shown in FIG. 6 after forming a second frontside ILD layer, wherein the first frontside ILD layer and the second frontside ILD layer collectively form a middle-of-the-line (MOL) dielectric layer and forming a frontside source/drain contact opening in the MOL dielectric layer that physically exposes the remaining original source/drain region.
FIG. 8 is a cross sectional view of the exemplary semiconductor structure shown in FIG. 7 after forming a patterned bilayer mask on the MOL dielectric layer, wherein the patterned bilayer mask protects the frontside source/drain contact opening and has a frontside gate contact opening formed therein.

Referring now to FIG. 7, there is illustrated the exemplary semiconductor structure shown in FIG. 6 after forming a second frontside ILD layer, wherein the first frontside ILD layer 32 and the second frontside ILD layer collectively form a MOL dielectric layer 48 and forming a frontside source/drain contact opening 50 in the MOL dielectric layer 48 that physically exposes the remaining original source/drain region 30. The second frontside ILD layer includes one of the dielectric materials mentioned above for the first frontside ILD layer 32. The dielectric material that provides the second frontside ILD layer can be compositionally the same as, or compositionally different from, the dielectric material that provides the first frontside ILD layer 32. The second frontside ILD layer is formed on top of each of the gate cap 46, the gate spacer 26, the dielectric cap 42 and the first frontside ILD layer 32. The second frontside ILD layer can be formed utilizing one of the deposition processes mentioned above in forming the first frontside ILD layer 32. The frontside source/drain contact opening 50 can be formed by lithography and etching.

Referring now to FIG. 8, there is illustrated the exemplary semiconductor structure shown in FIG. 7 after forming a patterned bilayer mask on the MOL dielectric layer 48, wherein the patterned bilayer mask protects the frontside source/drain contact opening 50 and has a frontside gate contact opening 56 formed therein. The patterned bilayer mask includes a lower masking layer 52 and an upper masking layer 54. The lower masking layer 52 is composed of a first masking material, while the upper masking layer is composed of a second masking material that is compositionally different from the first masking material. In one embodiment, the lower masking layer 52 is composed of an OPL material, and the upper masking layer 54 is composed of a Si-containing antireflective coating material. The patterned bilayer mask can be formed by first depositing the lower masking layer 52, second depositing the upper masking layer 54 and then lithographically patterning both the upper masking layer 54 and the lower masking layer 52.

Figures 9, 10:
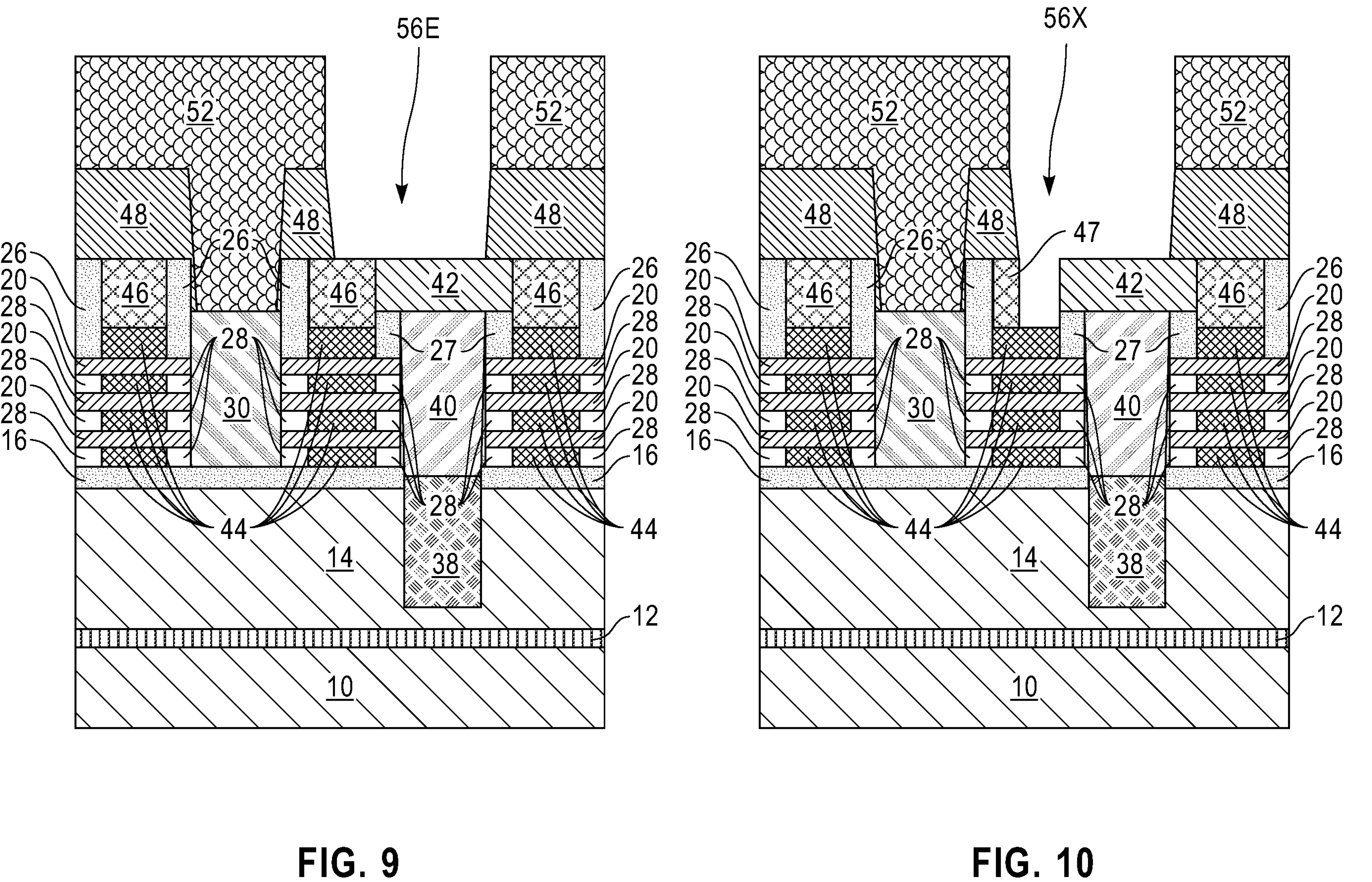
FIG. 9 is a cross sectional view of the exemplary semiconductor structure shown in FIG. 8 after performing an etch to extend the frontside gate contact opening into the MOL dielectric layer, wherein the extended frontside gate contact opening physically exposes a portion of the gate cap located on the gate structure, and a portion of the source/drain dielectric cap, and wherein the etch removes an upper masking layer of the patterned bilayer mask.
FIG. 10 is a cross sectional view of the exemplary semiconductor structure shown in FIG. 9 after performing another etch to extend the extended frontside gate contact opening through the physically exposed portion of the gate cap so as to physically expose a surface of the gate structure.

Referring now to FIG. 9, there is illustrated the exemplary semiconductor structure shown in FIG. 8 after performing an etch to extend the frontside gate contact opening 56 into the MOL dielectric layer 48 to form extended frontside gate contact opening 56E, wherein the extended frontside gate contact opening 56E physically exposes a portion of the gate cap 46 located on the gate structure 44, and a portion of the dielectric cap 42 that is located adjacent to the physically exposed gate cap 46, and wherein the etch removes an upper masking layer 54 of the patterned bilayer mask. The etch employed in forming the exemplary semiconductor structure illustrated in FIG. 9 includes an etch such as, for example, RIE, that is selective in removing the MOL dielectric layer 48.

Referring now to FIG. 10, there is illustrated the exemplary semiconductor structure shown in FIG. 9 after performing another etch to extend the extended frontside gate contact opening 56E through the physically exposed portion of the gate cap 46 so as to physically expose a surface of the gate structure 44. This step forms twice extended frontside gate contact opening 56X. The etch employed in forming the exemplary semiconductor structure illustrated in FIG. 10 includes an etch such as, for example, RIE, that is selective in removing the physically exposed portion of the gate cap 46. The twice extended frontside gate contact opening 56X exposes a sidewall of the dielectric cap 42 and leaves behind a gate cap pillar 47. The gate cap pillar 47 which is a remaining portion of the gate gap 46 is present on a first portion of the gate structure 44 (see, the middle gate structure 44 shown in FIG. 10).

Figures 11, 12:
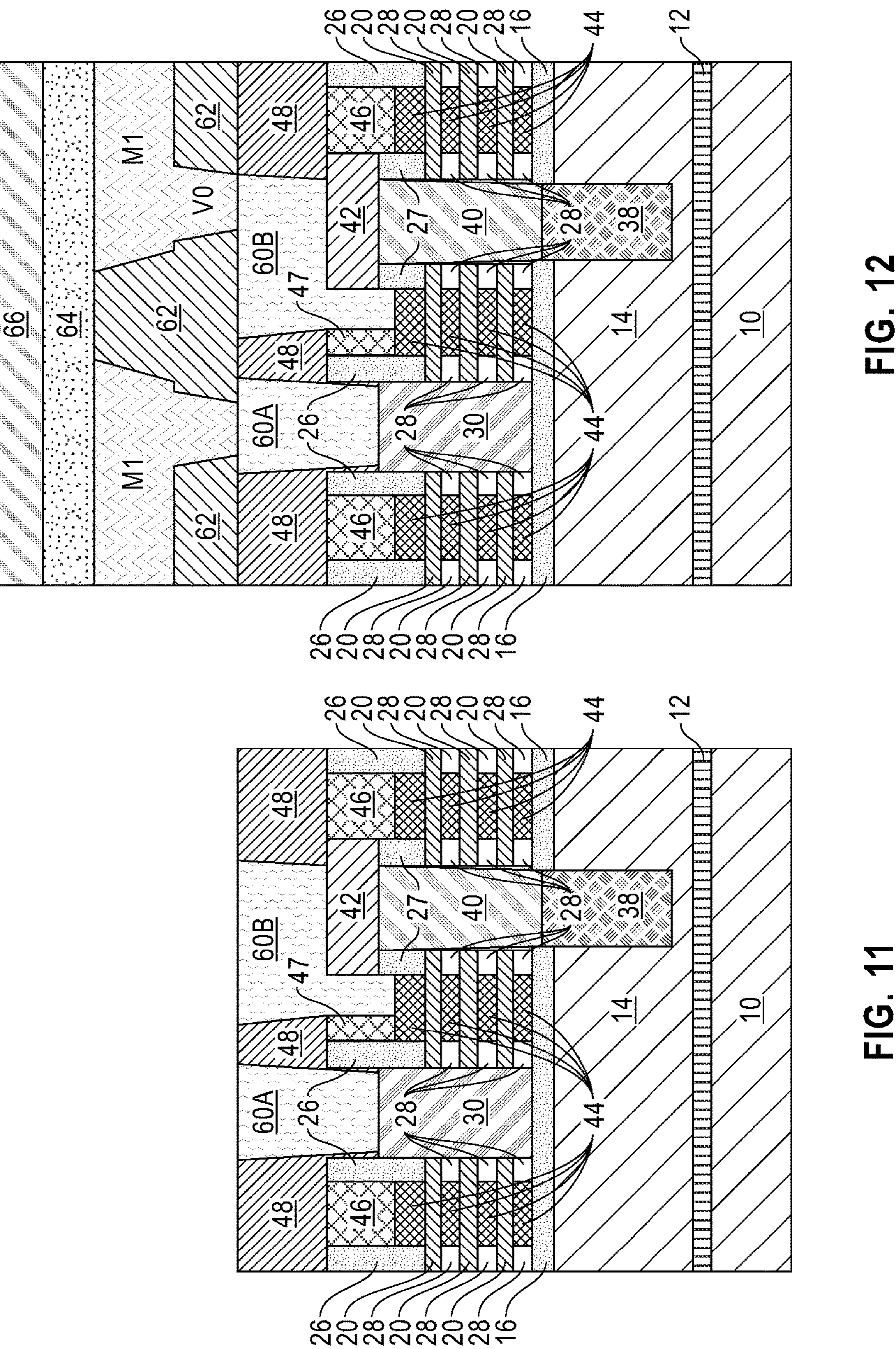
FIG. 11 is a cross sectional view of the exemplary semiconductor structure shown in FIG. 10 after removing the lower masking layer of the patterned bilayer mask and forming frontside contact structures into the frontside source/drain contact opening and the twice extended frontside gate contact opening.
FIG. 12 is a cross sectional view of the exemplary semiconductor structure shown in FIG. 11 after forming initial interconnect levels of a frontside BEOL structure including metal vias and metal lines, upper interconnect levels of the frontside BEOL structure, and a carrier wafer.

Referring now to FIG. 11, there is illustrated the exemplary semiconductor structure shown in FIG. 10 after removing the lower masking layer 52 of the patterned bilayer mask and forming frontside contact structures into the frontside source/drain contact opening 50 and the twice extended frontside gate contact opening 56X. The lower masking layer 52 of the patterned bilayer mask can be removed utilizing a material removal process that is selective in removing the lower masking layer 52. This removal process physically exposes the MOL dielectric layer 48 and the frontside source/drain contact opening 50.

The frontside contact structures are now formed into the MOL dielectric layer 48. The frontside contact structures include frontside source/drain contact structure 60A and a frontside gate contact structure 60B. The frontside contact structures are formed utilizing a metallization process. The metallization process includes filling (including deposition and planarization) those contact openings (i.e., frontside source/drain contact opening 50 and twice extended frontside gate contact opening 56X) with at least a contact conductor material. The contact conductor material that can be used for providing the frontside contact structures includes, for example, a silicide liner, such as Ni, Pt, NiPt, an adhesion metal liner, such as TiN, and conductive metals such as W, Cu, Al, Co, Ru, Mo, Os, Ir, Rh, or an alloy thereof. The frontside contact structures can also include one or more contact liners (not shown). In one or more embodiments, the contact liner (not shown) can include a diffusion barrier material. Exemplary diffusion barrier materials include, but are not limited to, Ti, Ta, Ni, Co, Pt, W, Ru, TiN, TaN, WN, WC, an alloy thereof, or a stack thereof such as Ti/TiN and Ti/WC. In one or more embodiments in which a contact liner is present, the contact liner (not shown) can include a silicide liner, such as Ti, Ni, NiPt, etc., and a diffusion barrier material, as defined above. A planarization process such as, for example, CMP, follows the filling of the frontside source/drain contact opening 50 and twice extended frontside gate contact opening 56X.

It is noted that the frontside gate contact structure 60B is located on a second portion of the gate electrode 44 and is off-centered relative to the gate structure 44 that it makes contact with. By "off centered" it is meant that a portion of the frontside gate contact structure 60B is not located directly above the gate structure 44 that it is in contact with. Instead, a portion of the frontside gate contact structure 60B is located directly over elements of the structure. In the present application, a portion of the frontside gate contact structure 60B is located directly above the dielectric cap 42 that is located on the replacement source/drain region 40. Thus, the frontside gate contact structure 60B can be referred to herein as an off-centered frontside gate contact structure which includes a first portion located directly above, and in direct physical contact with, the gate structure 44 and a second portion that is off-centered relative to the gate structure 44 and located directly above the dielectric cap 42. The first portion of the frontside gate contact structure 60B has a first side located along a sidewall of the gate cap pillar 47 and a second side opposite the first side, that is located along a sidewall of the dielectric cap 42. That is, the first portion of the frontside gate contact structure 60B is confined on the first side by the gate cap pillar 47 and confined on the second side by the dielectric cap 42.

Referring now to FIG. 12, there is illustrated the exemplary semiconductor structure shown in FIG. 11 after forming initial interconnect levels of a frontside BEOL structure including metal vias V0 and metal lines M1, upper interconnect levels 64 of the frontside BEOL structure, and a carrier wafer 66. The initial interconnect levels of the BEOL structure include frontside interconnect dielectric layers 62 that have metal vias V0 located in a lower frontside interconnect dielectric layer of the frontside interconnect dielectric layers 62, and metal lines M1 located in an upper frontside interconnect dielectric layer of the frontside interconnect dielectric layers 62.

The frontside interconnect dielectric layers 62 are composed of one of the dielectric materials mentioned above for the first frontside ILD layer 32. The frontside interconnect dielectric layers 62 can be formed utilizing a deposition process such as, for example, CVD, PECVD or spin-on-coating. The metal vias V0 and metal lines M1 are composed of any electrically conductive material including, but not limited to, tungsten (W), cobalt (Co), ruthenium (Ru), aluminum (Al), copper (Cu), platinum (Pt), rhodium (Rh), or palladium (Pd). A diffusion barrier, not shown, can be present on at least the sidewalls of the metal vias V0 and metal lines M1. The metal vias V0 and metal lines M1 can be formed utilizing a damascene process or a substrative etching process both of which are known to those skilled in the art. By forming an offset frontside gate contact structure 60B, the via over the frontside gate contact structure 60B can stay away from via over the frontside source/drain contact structure 60A, leading more space between M1 tip-to-tip above those two vias.

Next, upper interconnect levels 64 are formed on the initial interconnect levels. Collectively, the initial interconnect levels and the upper interconnect levels 64 provide the frontside BEOL structure. The upper interconnect levels 64 can include one or more interconnect dielectric material layers (including one of the dielectric materials mentioned above for the first frontside ILD layer 32) that contain additional frontside metal wiring embedded therein.

In the present application, a first metal via/metal line combination (far left-hand side V0/M1 combination shown in FIG. 12) is electrically connected to the frontside source/drain contact structure 60A and a second first metal via/metal line combination (far right-hand side V0/M1 combination shown in FIG. 12) is electrically connected to the frontside gate contact structure 60B.

The carrier wafer 66 can include one of the semiconductor materials mentioned above for the first semiconductor layer 10. Carrier wafer 66 is bonded to the frontside BEOL structure after frontside BEOL structure formation. This completes the processing of the frontside of the structure.

Figures 13, 14:
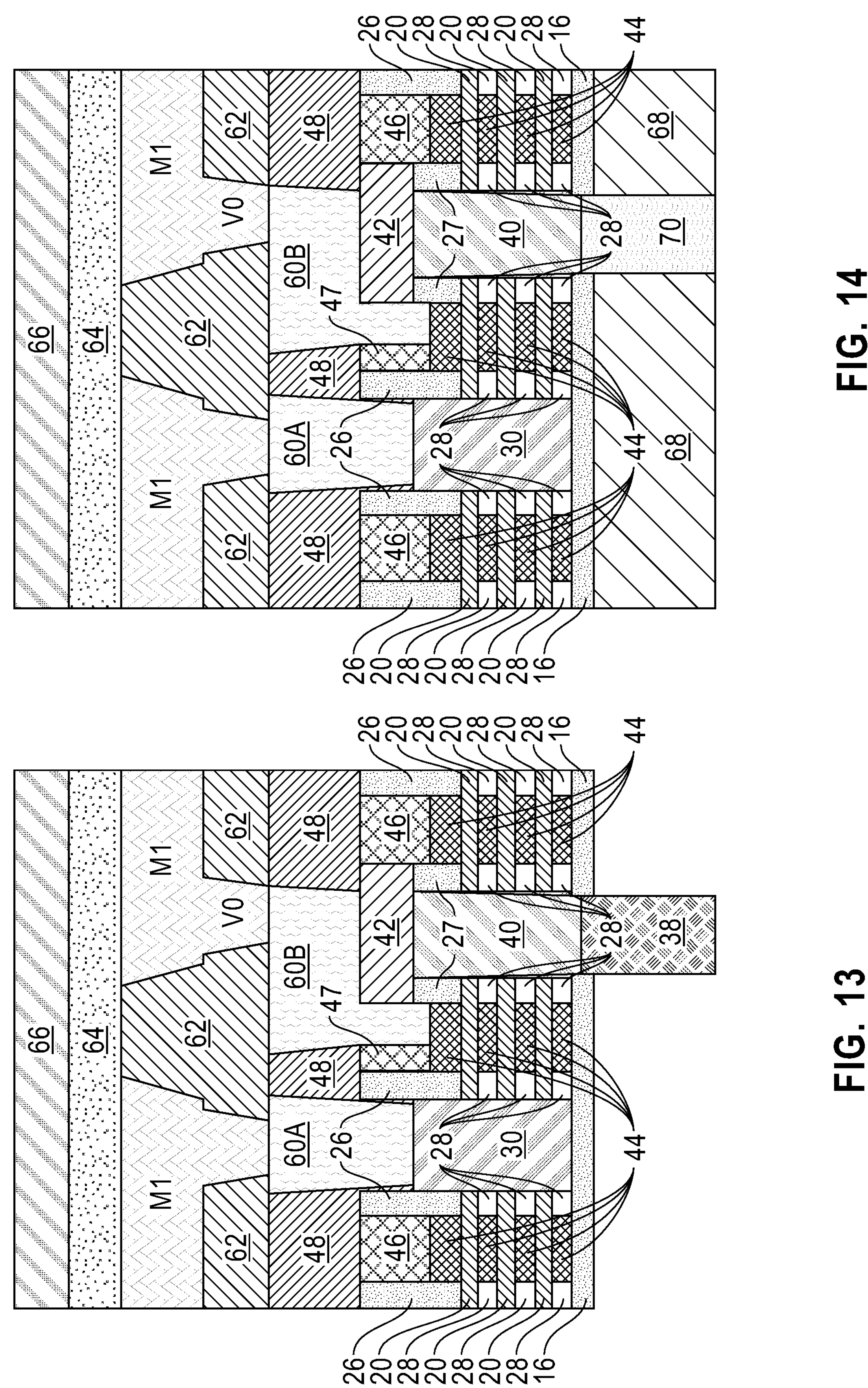
FIG. 13 is a cross sectional view of the exemplary semiconductor structure shown in FIG. 12 after removing the substrate to reveal the bottom dielectric isolation layer.
FIG. 14 is a cross sectional view of the exemplary semiconductor structure shown in FIG. 13 after forming a backside ILD layer and replacing the backside source/drain contact placeholder structure with a backside source/drain contact structure that directly contacts the replacement source/drain region.

Referring now to FIG. 13, there is illustrated the exemplary semiconductor structure shown in FIG. 12 after removing the substrate to reveal the bottom dielectric isolation layer 16. The removal of the substrate typically includes flipping the wafer 180° to physically expose a backside of the substate. This flipping step is not shown in the drawings of the present application for clarity. The flipping physically exposes the first semiconductor layer 10 and will allow backside processing of the exemplary structure. Flipping of the structure can be performed by hand or by utilizing a mechanical means such as, for example, a robot arm. In the illustrated embodiment, the removal of the substrate includes first removing the physically exposed first semiconductor layer 10 to reveal the etch stop layer 12. The removal of the first semiconductor layer 10 can be performed utilizing a material removal process that is selective in removing the first semiconductor material that provides the first semiconductor layer 10. Next, the revealed etch stop layer 12 and the second semiconductor layer 14 are successively removed. The removal of the etch stop layer 12 includes a material removal process that is selective in removing the etch stop layer 12. The removal of the etch stop layer 12 physically exposes the second semiconductor layer 14. The physically exposed second semiconductor layer 14 can be removed utilizing a material removal process that is selective in removing that layer from the structure. In the illustrated embodiment, the removal of the substrate reveals a surface of bottom dielectric isolation layer 16. Note that the removal of the substrate also reveals the backside source/drain contact placeholder structure 38.

Referring now to FIG. 14, there is illustrated the exemplary semiconductor structure shown in FIG. 13 after forming a backside ILD layer 68 and replacing the backside source/drain contact placeholder structure 38 with a backside source/drain contact structure 70 that directly contacts the replacement source/drain region 40. The backside ILD layer 68 is composed of one of the dielectric materials mentioned above for the first frontside ILD layer 32. The backside ILD layer 68 is located adjacent to the replacing the backside source/drain contact placeholder structure 38 and it can be formed utilizing a deposition process such as, for example, CVD, PECVD or spin-on-coating. A planarization process typically follows the deposition process to reveal a horizontal surface of the backside source/drain contact placeholder structure 38. The backside source/drain contact placeholder structure 38 is removed utilizing a material removal process, i.e., an etch, that is selective in removing the backside source/drain contact placeholder structure 38. The removal of the backside source/drain contact placeholder structure 38 provides a backside source/drain containing opening in the backside ILD layer 68 that physically exposes a surface of the replacement source/drain region 40. The backside source/drain contact structure 70 is then formed in this backside source/drain containing opening utilizing a metallization process and materials as mentioned above in forming the frontside contact structures.

Referring now to FIG. 15, there is illustrated the exemplary semiconductor structure shown in FIG. 14 after forming a backside interconnect structure 72. The backside interconnect structure 72 can include one or more interconnect dielectric material layers (including one of the dielectric materials mentioned above for the first frontside ILD layer 32) that contain backside metal wiring (the metal wiring can be composed of any electrically conductive metal or electrically conductive metal alloy) embedded therein.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:

a transistor comprising a gate structure, a first source/drain region present on a first side of the gate structure and a second source/drain region present on a second side of the gate structure, wherein the second side of the gate structure is opposite the first side of the gate structure;

a gate spacer located on the first side of the gate structure and a recessed gate spacer located on the second side of the gate structure, wherein the recessed gate spacer has a height that is less than the gate spacer;

a dielectric cap located on a first surface of the second source/drain region;

an off-centered frontside gate contact structure having a first portion located directly above, and in direct physical contact with, the gate structure of the transistor, and a second portion off-set relative to the gate structure and located directly on the dielectric cap; and a backside source/drain contact structure located on a second surface of the second source/drain region, wherein the second surface of the second source/drain region is opposite the first surface of the second source/drain region.

2. The semiconductor structure of claim 1, further comprising a gate cap pillar located adjacent to the off-centered frontside gate contact structure and on the gate structure.

3. The semiconductor structure of claim 2, wherein the gate cap pillar is located on a first side of the first portion of the off-centered frontside gate contact structure and the dielectric cap is located on a second side of the first portion of the off-centered frontside gate contact structure.

4. The semiconductor structure of claim 2, wherein the gate cap pillar is composed of a dielectric material that is compositionally different from a dielectric material that provides the dielectric cap.

5. The semiconductor structure of claim 1, further comprising a frontside source/drain contact structure directly contacting the first source/drain region.

6. The semiconductor structure of claim 5, further comprising a middle-of-the-line (MOL) dielectric layer partially embedding both the frontside source/drain contact structure and the off-centered frontside gate contact structure.

7. The semiconductor structure of claim 6, further comprising a frontside back-end-of-the-line (BEOL) structure located on the MOL dielectric layer, wherein the frontside BEOL structure comprises initial interconnect levels including metal vias and metal lines.

8. The semiconductor structure of claim 7, wherein a first metal via/metal line combination is electrically connected to the frontside source/drain contact structure and a second first metal via/metal line combination is electrically connected to the off-centered frontside gate contact structure.

9. The semiconductor structure of claim 1, further comprising a backside interconnect structure in direct contact with the backside source/drain contact structure.

10. The semiconductor structure of claim 1, wherein the recessed gate spacer laterally separates the gate structure from the second source/drain region.

11. The semiconductor structure of claim 10, wherein the dielectric cap has a width that is greater than a width of the second source/drain region.

12. The semiconductor structure of claim 11, wherein the dielectric cap extends onto a surface of the recessed gate spacer that is positioned between the gate structure and the second source/drain region.

13. The semiconductor structure of claim 12, wherein the recessed gate spacer has a topmost surface that is coplanar with a topmost surface of the second source/drain region.

14. The semiconductor structure of claim 1, wherein the transistor is a nanosheet transistor, and the nanosheet transistors comprises a nanosheet stack comprising a plurality of vertically stacked and spaced apart semiconductor channel material nanosheets, wherein the gate structure wraps around a portion of each of the semiconductor channel material nanosheets of the plurality of vertically stacked and spaced apart semiconductor channel material nanosheets.

15. The semiconductor structure of claim 1, wherein the second source/drain region is a replacement source/drain region.

* * * * *